United States Patent
Lee (10) Patent No.: US 6,999,136 B2
(45) Date of Patent: Feb. 14, 2006

(54) LIQUID CRYSTAL DISPLAY AND FABRICATING METHOD THEREOF

(75) Inventor: Seok Woo Lee, Ahnyang (KR)

(73) Assignee: LG.Philips LCD Co., Ltd., Seoul (KR)

( * ) Notice: Subject to any disclaimer, the term of this patent is extended or adjusted under 35 U.S.C. 154(b) by 244 days.

(21) Appl. No.: 10/662,389

(22) Filed: Sep. 16, 2003

(65) Prior Publication Data

US 2004/0075783 A1    Apr. 22, 2004

(30) Foreign Application Priority Data

Sep. 17, 2002  (KR) ................................ 10-2002-0056504

(51) Int. Cl.
*G02F 1/13* (2006.01)

(52) U.S. Cl. ............................ 349/43; 349/47; 349/153

(58) Field of Classification Search ................. 349/43, 349/47, 153
See application file for complete search history.

(56) References Cited

U.S. PATENT DOCUMENTS 6,670,635 B1 * 12/2003  Yamazaki et al. ............ 257/59

* cited by examiner

*Primary Examiner*—James A. Dudek
(74) *Attorney, Agent, or Firm*—McKenna Long & Aldridge LLP (57) ABSTRACT

A method of fabricating a liquid crystal display includes forming a gate insulating film to have different thickness in accordance with position. A liquid crystal display according to an embodiment of the present invention comprises a first thin film transistor formed in a picture display part together with liquid crystal cells each provided at each crossing area of a plurality of signal lines for driving each of the liquid crystal cells; a second thin film transistor included in a drive circuit that generates a drive signal to drive the signal lines and formed in a drive circuit part located at the outer area of the picture display part; and a gate insulating film formed between an active layer and each gate electrode included in each of the first and second thin film transistors, and having a structure of at least two-layers, inclusive of an etch-stopper layer, and wherein the gate insulating films of the first and second thin film transistors are formed to have different thickness from each other.

15 Claims, 11 Drawing Sheets

LIQUID CRYSTAL DISPLAY AND FABRICATING METHOD THEREOF

This application claims the benefit of the Korean Patent Application No. 2002-56504 filed on Sep. 17, 2002, which is hereby incorporated by reference for all purposes as if fully set forth herein.

BACKGROUND OF THE INVENTION

1. Field of the Invention

The present invention relates to a liquid crystal display, and more particularly to a method of fabricating a liquid crystal display that includes a gate insulating film having different thickness in accordance with position, and a liquid crystal display having a gate insluting film having different thickness in accordance with position thereof.

2. Discussion of the Related Art

Generally, liquid crystal displays (hereinafter, referred to as LCD) control the light transmittance of liquid crystal cells in accordance with video signals, thereby displaying pictures corresponding to the video signals on a liquid crystal display panel where the liquid crystal cells are arranged in a matrix. In this case, a thin film transistor (hereinafter, referred to as TFT) is typically used as a switching device for the liquid crystal cells.

In such as a thin film transistor, a semiconductor layer is made from amorphous silicon or polycrystalline silicon. An amorphous LCD has an advantage in that it has relatively better uniformity and stable property, but also has a disadvantage in that pixel density is difficult to improve because the charge mobility of amorphous silicon is low. Differently from this, a polycrystalline LCD has an advantage in that the charge mobility of crystalline silicon is high, so that pixel density may be increased. Further, drive circuits requiring relatively rapid response time are mounted on a liquid crystal display panel to reduce a fabricating cost.

Such a polycrystalline LCD includes a liquid crystal display panel where liquid crystal cells are arranged in a matrix, and a drive circuit to drive the liquid crystal display panel. The liquid crystal display panel includes a picture display part having red, green and blue pixels formed at each intersection area of gate lines and data lines. Each of the red, green and blue pixels is comprised of one thin film transistor and one liquid crystal cell. The liquid crystal display panel is provided with a pixel electrode and a common electrode to apply electric field to each liquid crystal cell. Each pixel electrode is connected to any one of the data lines through source and drain terminals of the TFT, the switching device. A gate terminal of the TFT is connected any one of the gate lines that apply pixel voltage signals to the pixel electrodes of one line at a time. The drive circuit includes a gate driver to drive the gate lines and a data driver to drive data lines. The gate driver sequentially applies scan signals to the gate lines, thereby sequentially driving the liquid crystal cells of one line on the liquid crystal display at a time. The data driver supplies video signals to each data line whenever the gate signal is applied to any one of the gate lines. And the liquid crystal display further includes multiplexors connected between the data driver and the data lines. A plurality of switch devices included in the multiplexor are sequentially turned on for each horizontal period, thereby sequentially supplying the video signals through data input line from the data driver to the data lines. The multiplexors are formed within the liquid crystal display panel together with the picture display part.

Figure 1:
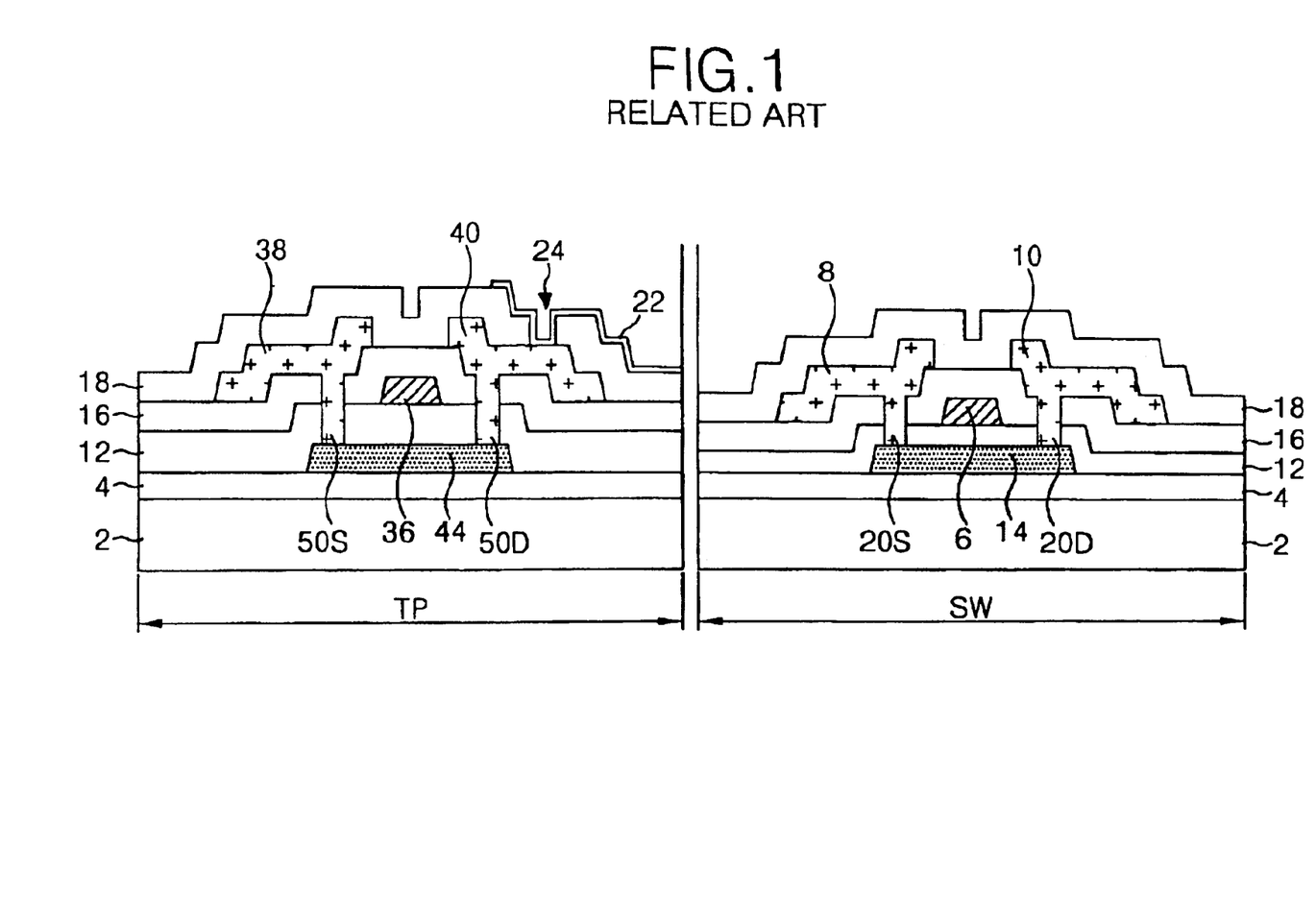
FIG. 1 is a sectional diagram representing the lower substrate of a switch device of a multiplexor and the lower substrate of a thin film transistor of a picture display part in a polycrystalline liquid crystal display of the related art.

Referring to FIG. 1, each switch device SW included in the multiplexor MUX has the same configuration as the thin film transistor TP of the picture display part.

Each switch device includes an active layer 14 formed on a lower substrate 2 with a buffer film 4 therebetween, a gate electrode 6 formed to overlap an active layer 14 with a gate insulating film 12 therebetween, and a source electrode 8 and a drain electrode 10 formed to be insulated from the gate electrode 6 with a go-between insulating film 16 therebetween. Herein, the source electrode 8 and the drain electrode 10 are connected to the active layer 14 through a source contact hole 20S and a drain contact hole 20D penetrating the go-between insulating film 16 and the gate insulating film 12. The protective film 18 protects the switch devices SW.

The thin film transistor TP includes an active layer 44 formed on the lower substrate 2 with the buffer film 4 therebetween, a gate electrode 36 formed to overlap the active layer 44 with the gate insulating film 12 therebetween, and a source electrode 38 and a drain electrode 40 formed to be insulated from the gate electrode 36 with the go-between insulating film 36 therebetween. Herein, the source electrode 38 and the drain electrode 40 are connected to the active layer 44 through a source contact hole 50S and a drain contact hole 50D penetrating the go-between insulating film 16 and the gate insulating film 12. The protective film 18 protects the thin film transistor TP. The drain electrode 40 of the thin film transistor TP is electrically connected to a pixel electrode 22 through a pixel contact hole 24 penetrating the protective film 18.

FIGS. 2A to 2H are sectional diagrams representing a fabricating method of a lower substrate provided with switch devices and thin film transistors shown in FIG. 1.

Figure 2A:
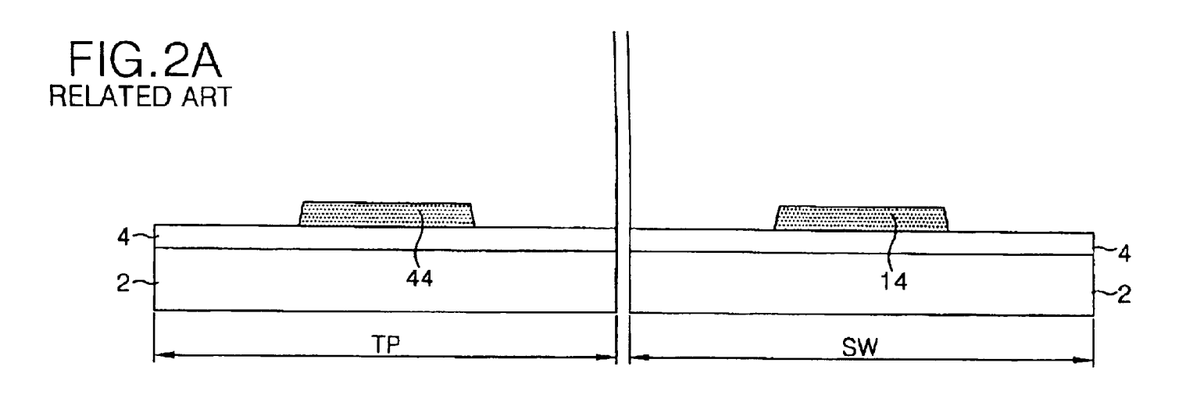
FIGS. 2A to 2H are sectional diagrams representing a fabricating method of the lower substrate of the switch device of the multiplexor and the thin film transistor of the picture display part shown in FIG. 1.

Firstly, the buffer film 4 of insulating material, such as $SiO_2$, is deposited on the lower substrate 2, and then an amorphous silicon film is deposited on top of it. Subsequently, the amorphous silicon film is crystallized by means of a laser to form a polycrystalline silicon film, which is patterned, as shown in FIG. 2A, to form the active layer 44 of the thin film transistor TP and the active layer 14 of the switch device SW.

Figure 2B:
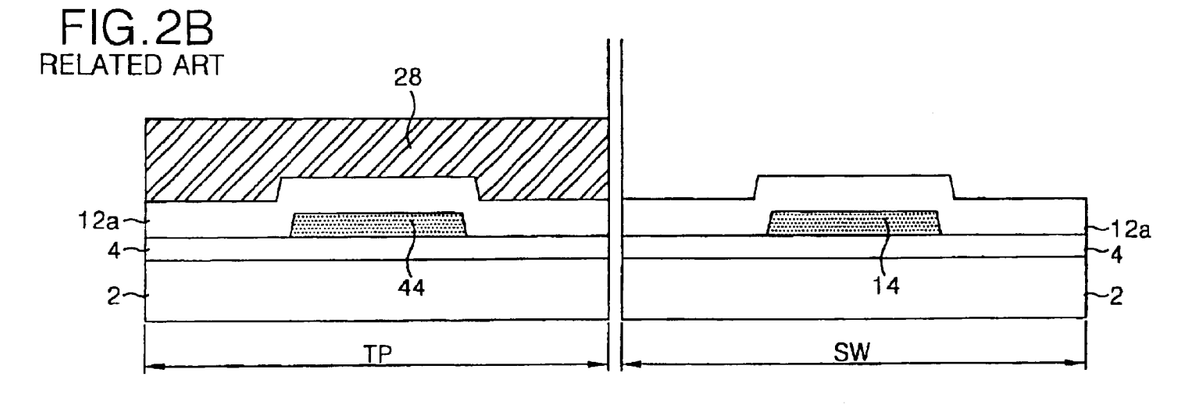
Figure 2C:
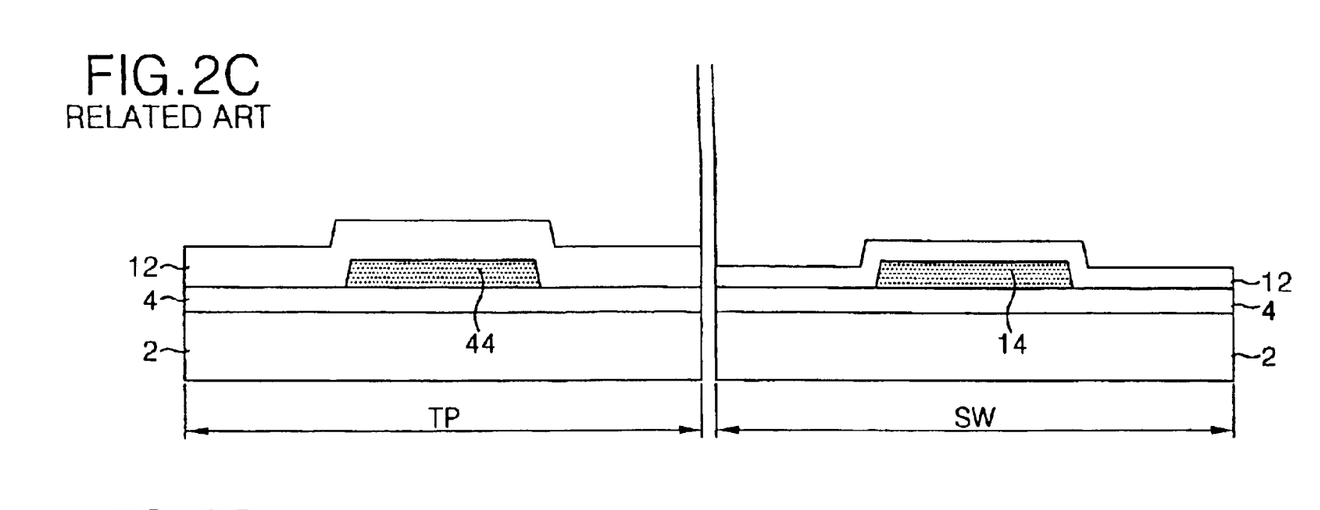

A gate insulating material 12a is deposited on the entire surface of the buffer film 4 with the active layers 14 and 44 thereon. Then, a photoresist is deposited on the entire surface of the gate insulating material 12a, and then is patterned, thereby forming a photoresist pattern 28 on the gate insulating material 12a. The gate insulating material 12a is patterned by a wet etching process using the photoresist pattern 28 as a mask, thereby forming the gate insulating film 12, as shown in FIG. 2C. At this moment, the gate insulating film 12 of the switch device SW is relatively thinner than the gate insulating film 12 of the thin film transistor TP.

Figure 2D:
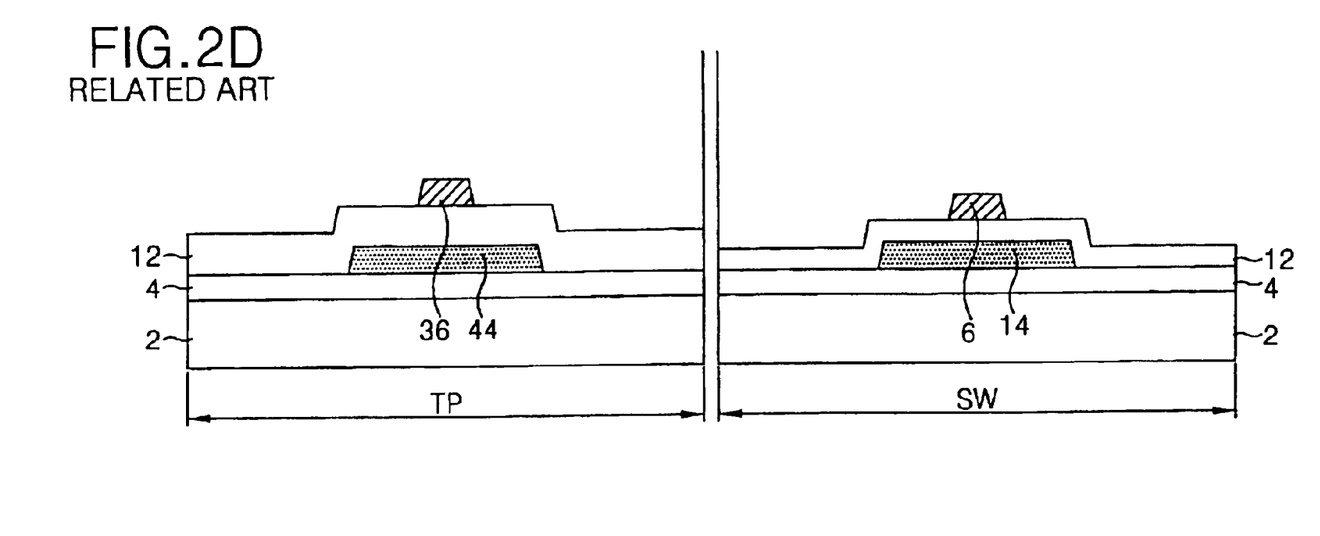

A gate metal layer is deposited on the gate insulating film 12, and then is patterned, thereby forming the gate electrode 6 of the switch device SW and the gate electrode 36 of the thin film transistor TP, as shown in FIG. 2D.

Figure 2E:
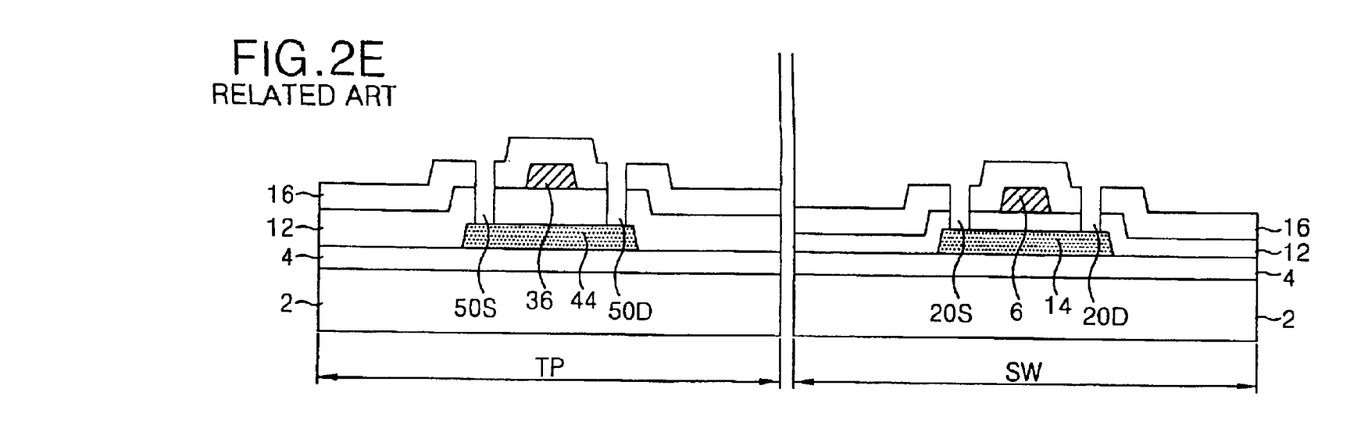

The go-between insulating film 16 is deposited on the entire surface of the gate insulating film 12 provided with the gate electrodes 6 and 36, and then is patterned, thereby forming the source contact holes 20S and 50S and the drain contact holes 20D and 50D of the switch device SW and the thin film transistor TP penetrating the go-between insulating film 16 and the gate insulating film 12, as shown in FIG. 2E.

Figure 2F:
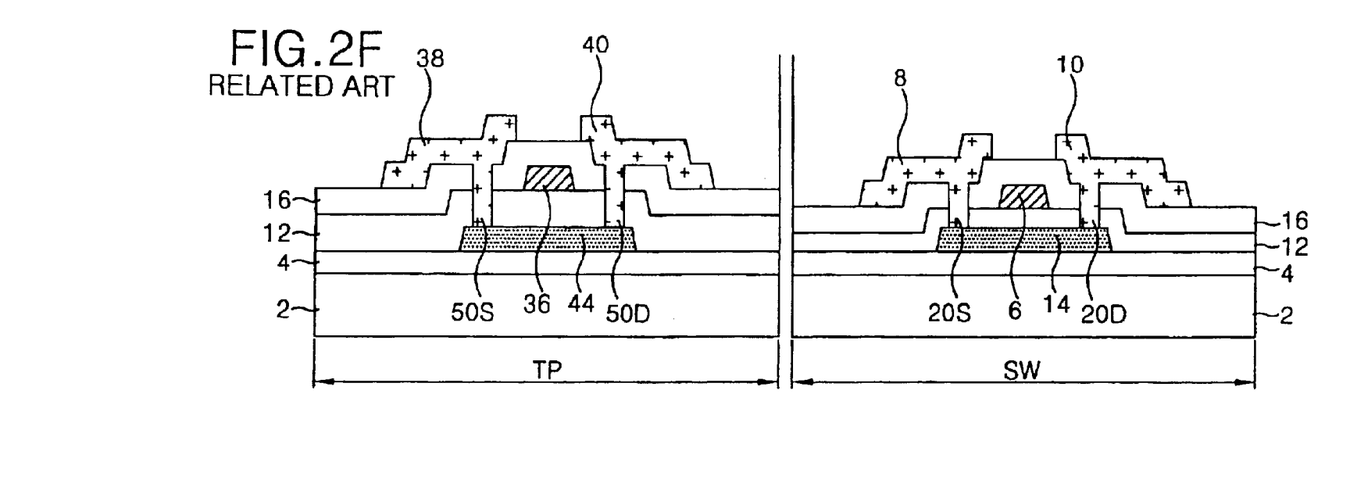

After this, a source/drain metal layer is deposited, and then is patterned, thereby forming the source electrodes 8 and 38 and the drain electrodes 10 and 40 of the switch devices SW and the thin film transistors TP, as shown in FIG. 2F. Herein, the source electrodes 8 and 38 and the drain electrodes 10 and 40 of the switch device SW and the thin film transistor TP are each connected to the active layers 14 and 44 through each of the source contact holes 20S and 50S, and the drain contact holes 20D and 50D, respectively.

Figure 2G:
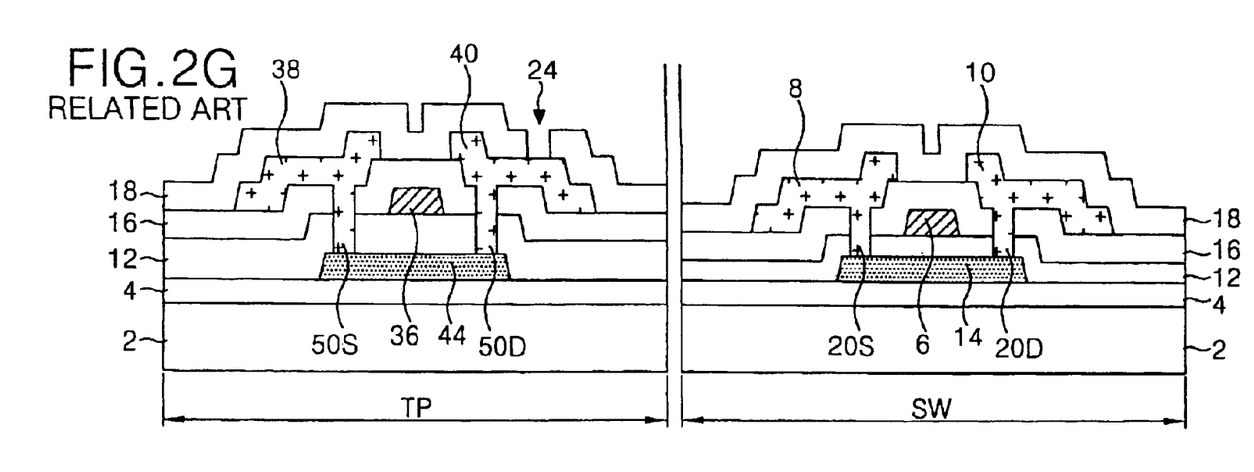

The protective film 18 is deposited on the entire surface of the go-between insulating film 16 where the source electrodes 8 and 38 and the drain electrodes 10 and 40 of the switch device SW and the thin film transistor TP are formed, and then is patterned, thereby forming the pixel contact hole 24 to expose the drain electrode 40 of the thin film transistor TP, as shown in FIG. 2G.

Figure 2H:
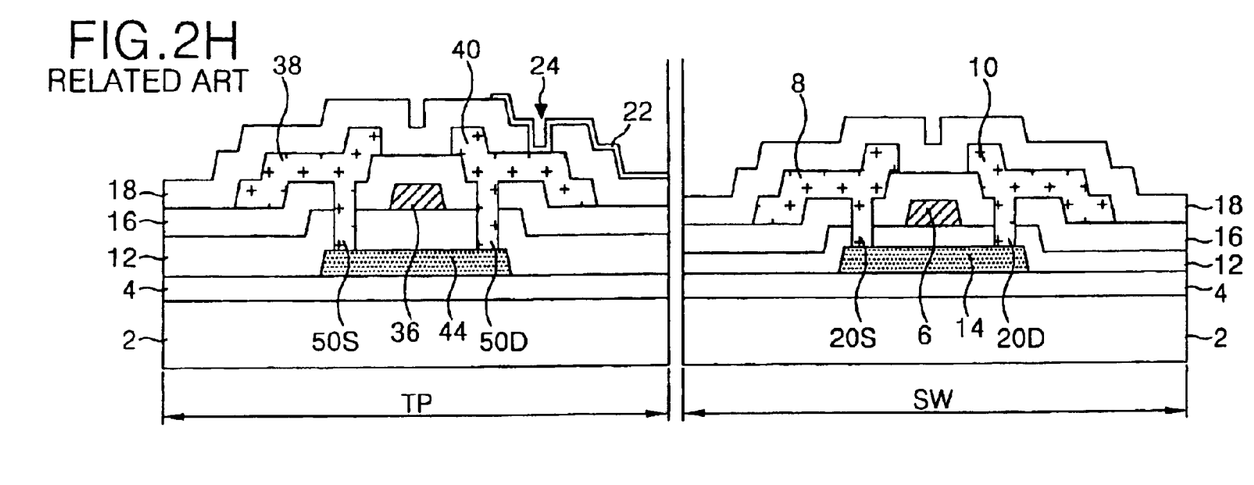

A transparent conductive material is deposited on the protective film 18, and then is patterned, thereby forming the pixel electrode 22 connected to the drain electrode 40 of the thin film transistor TP through the pixel contact hole 24, as shown in FIG. 2H.

In this way, the polycrystalline LCD of the related art has a drive circuit like the multiplexor MUX formed on the lower substrate 2 together with the thin film transistor array included in the pixel display part 16. The gate insulating film 12 between the gate electrode 6 and the active layer 14 of the switch device included in the multiplexor is thinner than the gate insulating film 12 of the thin film transistor array. The capacitance of the capacitor formed between the active layer 14 and the gate electrode 6 with the gate insulating film 12 of the switch device SW therebetween is relatively higher than that of the thin film transistor array. The threshold voltage value of the switch device SW becomes relatively low in proportion to the capacitance of such a capacitor, so that the operation speed of the switch device can be improved.

However, there is difficulty in making the gate insulating film of the thin film transistor TP and the gate insulating film of the switch device SW uniform in their final thickness during the etching process for forming the gate insulating film 12, wherein the gate insulating film of the switch device SW is relatively thin and the gate insulating film of the thin film transistor TP is included in the picture display part.

SUMMARY OF THE INVENTION

Accordingly, the present invention is directed to a liquid crystal display device and fabricating method thereof that substantially obviates one or more problems due to limitations and disadvantages of the related art.

Accordingly, it is an advantage of the present invention to provide a liquid crystal display that is capable of forming a gate insulating film to have different thickness in accordance with position, and a fabricating method thereof.

In order to achieve these and other objects of the invention, a liquid crystal display according to an aspect of the present invention comprises a first thin film transistor formed in a picture display part together with liquid crystal cells each provided at each intersection area of a plurality of signal lines for driving each of the liquid crystal cells; a second thin film transistor included in a drive circuit that generates a drive signal to drive the signal lines and formed in a drive circuit part located at the outer area of the picture display part; and a gate insulating film formed between an active layer and each gate electrode included in each of the first and second thin film transistors, and having a structure of at least two-layers, inclusive of an etch-stopper layer, and wherein the gate insulating films of the first and second thin film transistors are formed to have different thickness from each other.

Herein, the gate insulating film of the first thin film transistor is formed to be thicker than the gate insulating film formed between the active layer and the gate electrode of the second thin film transistor.

Herein, the gate insulating film of the first thin film transistor has a structure of three layers, the middle layer of which is the etch-stopper layer.

Herein, the gate insulating film of the second thin film transistor has a structure of two layers, the uppermost layer of which is the etch-stopper layer.

Herein, the response times of the first and second thin film transistors are different because of the gate insulating film.

Herein, the etch-stopper layer is formed of silicon nitride SiNx.

Herein, the uppermost layer and the lowermost layer of the gate insulating film of the first thin film transistor and the lowermost layer of the gate insulating film of the second thin film transistor are formed of silicon dioxide $SiO_2$.

A fabricating method of a liquid crystal display having a first thin film transistor formed in a picture display part together with liquid crystal cells each provided at each intersection area of a plurality of signal lines for driving each of the liquid crystal cells, and a second thin film transistor included in a drive circuit that generate a drive signal for driving the signal lines and formed at in a drive circuit part located at the outer part of the picture display part, according to another aspect of the present invention, the fabricating method comprising the steps of forming a gate insulating film between an active layer and each gate electrode included in each of the first and second thin film transistors, and wherein the gate insulating film has a structure of at least two-layers, inclusive of an etch-stopper layer, and the gate insulating films of the first and second thin film transistors have different thickness from each other.

The fabricating method further includes the steps of forming a buffer film of the first and second thin film transistors on a substrate; forming an active layer of the first and second thin film transistors on the buffer film; forming a gate electrode of each of the first and second thin film transistors on the gate insulating film; forming a go-between insulating film of the first and second thin film transistors on the gate insulating film provided with the gate electrode; forming a source electrode and a drain electrode of each of the first and second thin film transistors on the go-between insulating film; forming a protective film of the first and second thin film transistors; and forming a pixel electrode connected to the drain electrode of the first thin film transistor.

In the method, the gate insulating film of the first thin film transistor has a structure of three layers, the middle layer of which is the etch-stopper layer.

In the method, the gate insulating film of the second thin film transistor has a structure of two layers, the uppermost layer of which is the etch-stopper layer.

In the method, the etch-stopper layer is formed of silicon nitride SiNx.

In the method, the uppermost layer and the lowermost layer of the gate insulating film of the first thin film transistor and the lowermost layer of the gate insulating film of the second thin film transistor are formed of silicon dioxide $SiO_2$.

It is to be understood that both the foregoing general description and the following detailed description are exemplary and explanatory and are intended to provide further explanation of the invention as claimed.

BRIEF DESCRIPTION OF THE DRAWINGS

The accompanying drawing, which are included to provide a further understanding of the invention and are incorporated in and constitute a part of this specification illustrate embodiments of the invention and together with the description serve to explain the principles of the invention.

In the drawings.

DETAILED DESCRIPTION OF THE ILLUSTRATED EMBODIMENTS

Reference will now be made in detail to the embodiments of the present invention, examples of which are illustrated in the accompanying drawings.

Figure 3:
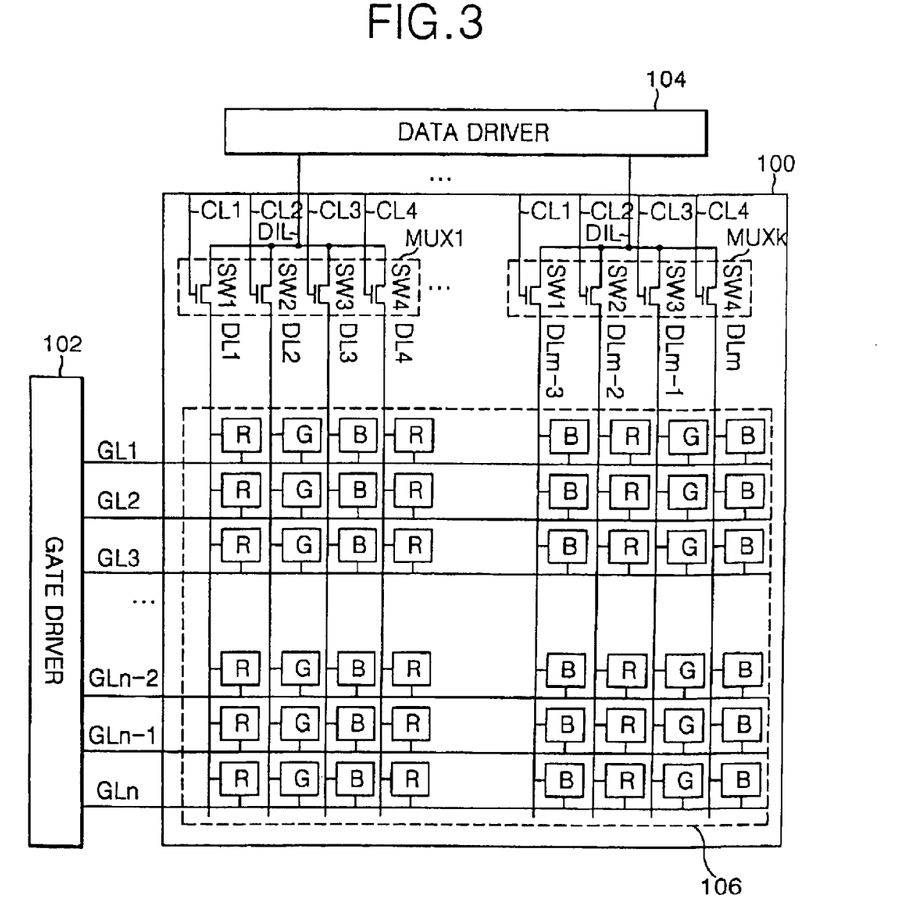
FIG. 3 is a plan view schematically illustrating a configuration of a polycrystalline liquid crystal display according to the present invention.

FIG. 3 is a plan view representing a polycrystalline liquid crystal display according to the present invention.

Referring to FIG. 3, the liquid crystal display includes a gate driver 102 to drive gate lines GL1 to GLn of a liquid crystal display panel 100, and a data driver 104 to drive data lines DL1 to DLm of the liquid crystal display panel 100.

The liquid crystal display panel 100 includes a picture display part 106 having red, green and blue pixels R, G, B, each of which is formed at each crossing area of the gate lines GL1 to GLn and the data lines DL1 to DLm. Each of the red, green and blue pixels R, G and B includes one thin film transistor and one liquid crystal cell. The gate electrode and the source electrode of the thin film transistor are connected to the gate line GL and the data line DL, respectively. The liquid crystal cell includes a pixel electrode connected to the thin film transistor, and a common electrode, reference electrode, facing the pixel electrode with the liquid crystals therebetween.

The gate driver 102 sequentially drives the gate lines GL1 to GLn by horizontal lines for each frame in response to gate control signals. The gate driver 102 causes the thin film transistors sequentially to be turned on for each horizontal line, thereby connecting the data line DL1 to DLm to the liquid crystal cell.

The data driver 104 samples a plurality of digital data signals to convert the sampled signals to analog data signals for each horizontal period. The data driver 104 supplies the analog data signal to the data lines DL1 to DLm. Accordingly, the liquid crystal cells connected to the turned-on thin film transistors control the light transmittance in response to data signals from the data lines DL1 to DLm.

The liquid crystal display further includes multiplexors MUX1 to MUXk connected between the data driver 104 and the data lines DL1 to DLm. Each multiplexor MUX1 to MUXk is connected to a plurality of the data lines, e.g., four of the data lines DLi to DLi+3. Each multiplexor MUX1 to MUXk sequentially supplies video signals to the four data lines DLi to DLi+3 by a first to a fourth control signal through a first to a fourth control line CL1 to CL4, wherein the video signals are supplied from the data driver 14 through a data input line. To this end, each multiplexor MUX1 to MUXk includes a data input line DIL connected to the data driver 104, and four switch devices SW1 to SW4 each connected between itself and each of the four data lines DLi to DLi+3. Each switch device SW1 to SW4 is implemented as a normal MOS transistor. The four switch devices SW1 to SW4 included in the multiplexor MUX receive the first to fourth control signals to their gate electrodes one by one. The first to fourth control signals each have an enable period, i.e., high logic period, which is sequentially and repeatedly. Accordingly, the four switching devices SW1 to SW4 included in the multiplexor MuX are sequentially turned on for each horizontal period, thereby sequentially connecting the four data lines DLi to DLi+3 to the data input line DIL that is connected to the data driver 104.

The multiplexors MUX1 to MUXk are formed within the liquid crystal display panel 100 together with the picture display part 106. In this example, the multiplexors MUX1 to MUXk are located above the picture display part 106.

Figure 4:
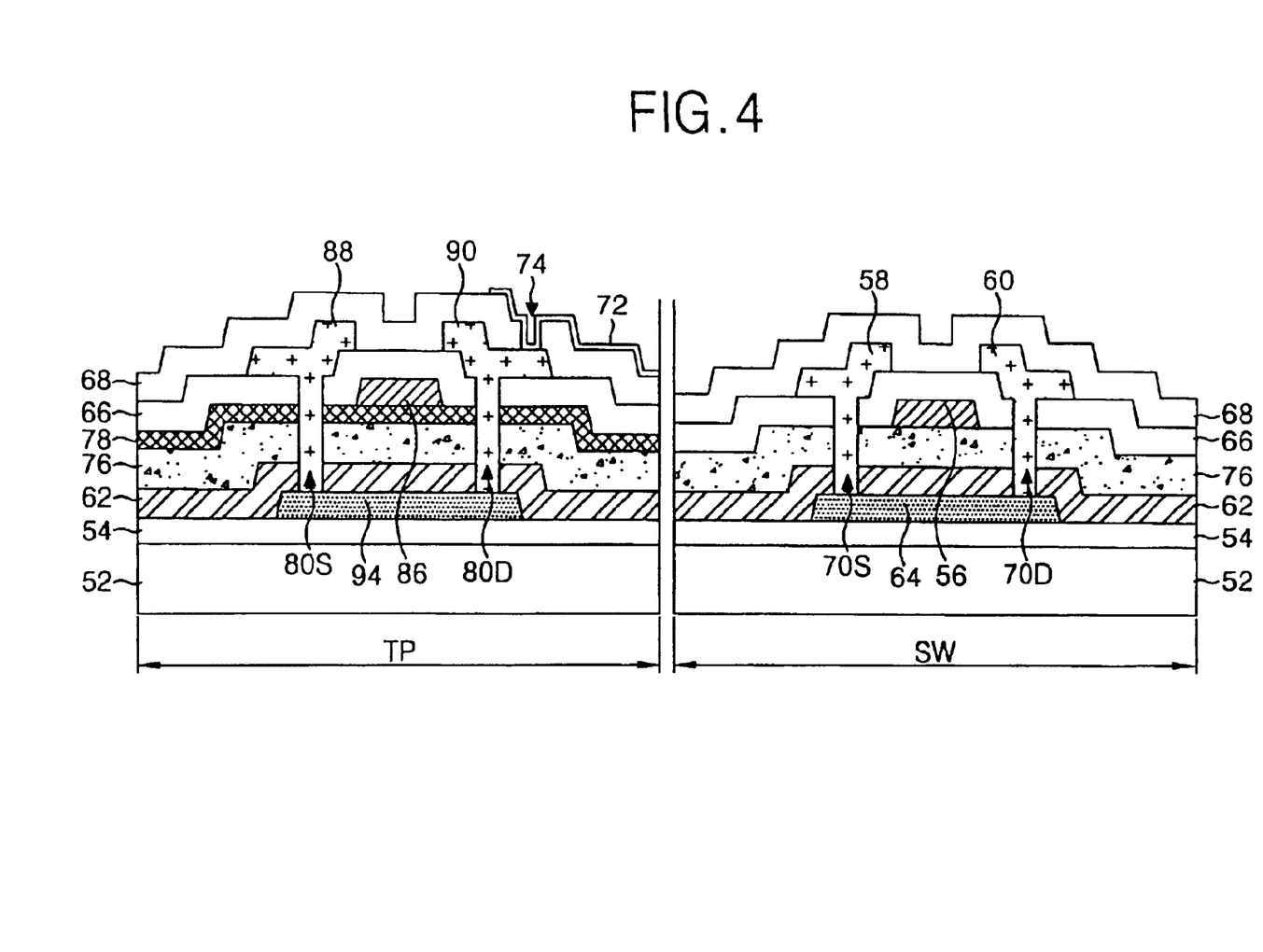
FIG. 4 is a sectional diagram representing the lower substrate of a switch device of a multiplexor and the lower substrate of a thin film transistor of a picture display part shown in FIG. 3.

The first to fourth switch devices SW1 to SW4 included in the multiplexor, as illustrated in FIG. 4, each have the same configuration as the thin film transistors included in the picture display part.

Each switch device SW includes an active layer 64 formed on a lower substrate 52 with a buffer film 54 therebetween, a gate electrode 56 formed to overlap the active layer 64 with first and second gate insulating films 62 and 76 therebetween, and a source electrode 58 and a drain electrode 60 formed to be insulated from the gate electrode 56 with a go-between insulating film 66. In the exemplary switch device illustrated in FIG. 4, the source electrode 58 and the drain electrode 60 are connected to an active layer 64 through a source contact hole 70S and a drain contact hole 70D penetrating a go-between insulating film 66 and first and second gate insulating films 62 and 76. A protective film 68 protects the switch device SW.

Each thin film transistor TP includes an active layer 94 formed on a lower substrate 52 with a buffer film 54 therebetween, a gate electrode 86 formed to overlap the active layer 94 with first to third gate insulating films 62, 76 and 78 therebetween, and a source electrode 88 and a drain electrode 90 formed to be insulated from the gate electrode 86 with a go-between insulating film 66. Herein, the source electrode 88 and the drain electrode 90 are connected to an active layer 94 through a source contact hole 80S and a drain contact hole 80D penetrating a go-between insulating film 66 and first to third gate insulating films 62, 76 and 78. The protective film 68 protects the thin film transistor TP. The drain electrode 90 of the thin film transistor TP is electrically connected to a pixel electrode 72 through a pixel contact hole 74 penetrating the protective film 68.

The first gate insulating film 62 may be formed of silicon dioxide $SiO_2$, and the second gate insulating film 76 may be formed of silicon nitride SiNx. Further, the third gate insulating film 78 of the thin film transistor may be formed of silicon dioxide $SiO_2$.

Herein, the second gate insulating film 76 acts as an etch-stopper, so that the third gate insulating film 78 is formed only at the thin film transistor TP. However, silicon nitride SiNx forming the second gate insulating film 76 is not in accord with the stoichiometry of $Si_3N_4$ in composition, thus its composition does not make a perfect combination. Accordingly, the second gate insulating film 76 has plenty of electrical defects to yield positive charges. In case that such a silicon nitride SiNx is used for the gate insulating film, its threshold voltage becomes unstable. In particular, this gets more serious when silicon nitride SiNx is located close to the active layers 64 and 94 that form channels. In order to solve such a problem, the first gate insulating film 62 may be formed of $SiO_2$, which may be the same material as used for the buffer film 54, at the lower part of the second gate insulating film 76.

The third gate insulating film 78 is formed between the active layer 94 and the gate electrode 86 of the picture display part, and the whole of the gate insulating film of the picture display part is formed to be relatively thicker than the whole of the gate insulating film of the switch device. Accordingly, the threshold voltage of the switch device SW becomes relatively low, thus the operation speed of the switch device SW is improved.

FIGS. 5A to 5H are sectional views representing a fabricating method of a lower substrate where a switch device of a multiplexor and a thin film transistor of a picture display part shown in FIG. 4 are formed.

Figure 5A:
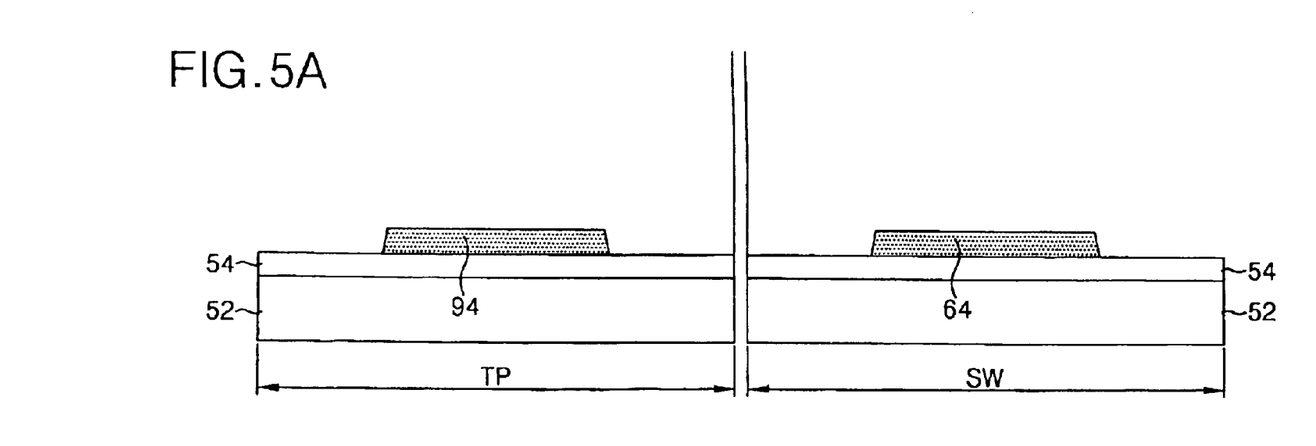
FIGS. 5A to 5H are sectional diagrams representing a fabricating method of the lower substrate of the switch device of the multiplexor and the thin film transistor of the picture display part shown in FIG. 4.

Referring to FIG. 5A, the active layer 94 of the thin film transistor TP and the active layer 64 of the switch device SW are formed on the lower substrate 52 with the buffer film 54 therebetween.

To this end, the buffer film 54 is formed by way of depositing an insulating material, such as $SiO_2$, on the lower substrate 52. After depositing an amorphous silicon film on the buffer film 54, the amorphous silicon is crystallized, for example, by a laser, to become a polycrystalline silicon film. The polycrystalline silicon film is patterned by a photolithography process and an etching process, thereby forming the active layer 94 of the thin film transistor TP and the active layer 64 of the switch device SW.

Figure 5B:
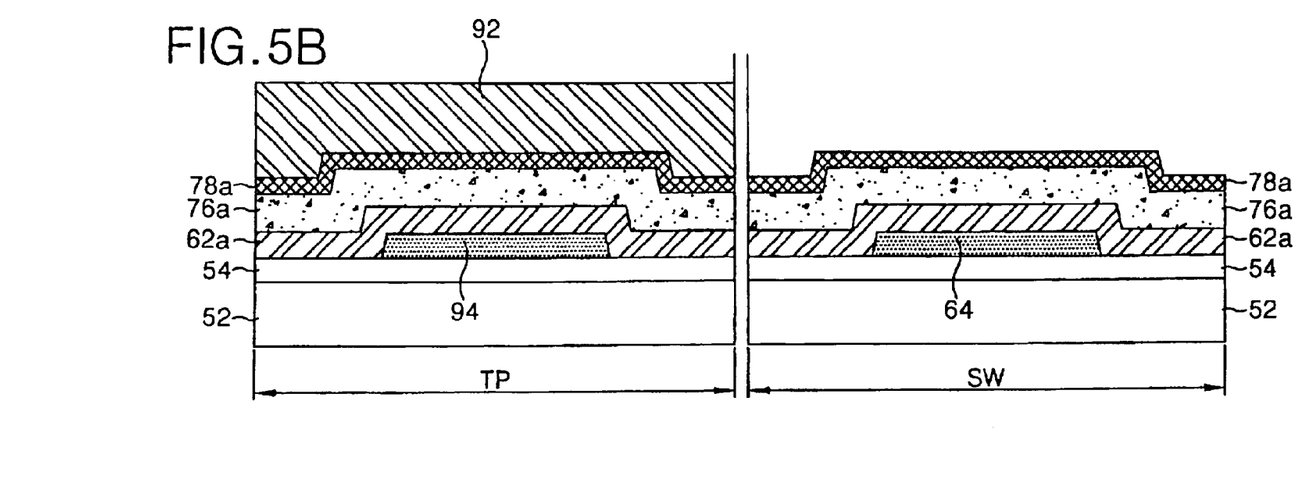

Referring to FIG. 5B, first to third gate insulating materials 62a, 76a and 78a are deposited on the entire surface on the lower substrate 52 provided with the active layers 64 and 94. Herein, the first and third gate insulating materials 62a and 78a may be made from silicon dioxide $SiO_2$, and the second gate insulating material 76a may be made from silicon nitride SiNx. After this, a photoresist is deposited on the entire surface of the third gate insulating material 78a, and then is patterned, thereby forming a photoresist pattern 92 on the third gate insulating material 78a that is formed to cover the active layer 94 of the thin film transistor TP.

Figures 5C, 5D:
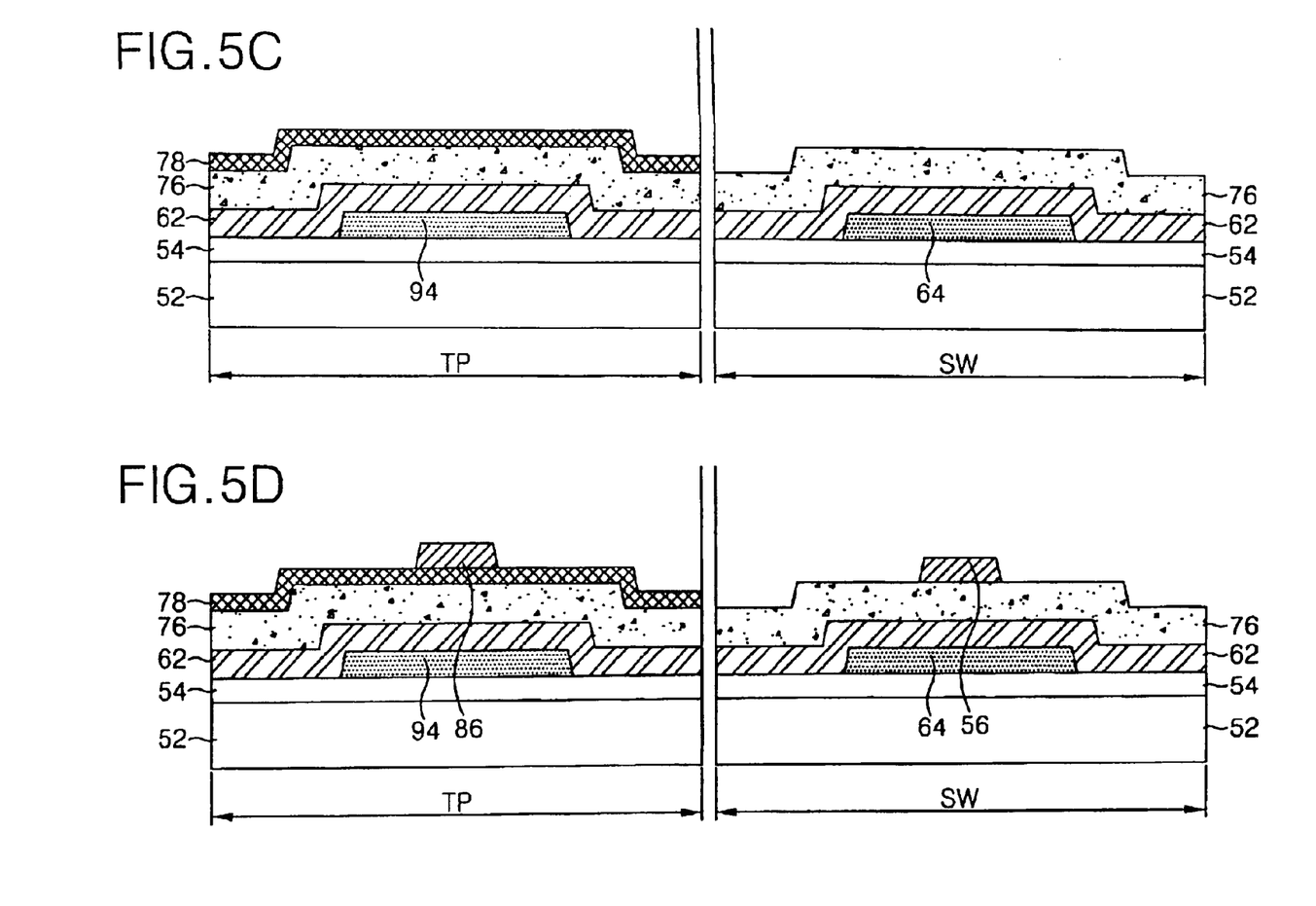

Referring to FIG. 5C, the wet etching process is carried out in use of the photoresist pattern 92 as a mask. At this moment, silicon dioxide $SiO_2$, the third gate insulating material, has a different etching selection ratio from silicon nitride SiNx, the second gate insulating material, with respect to a diluted hydrofluoric acid HF solution, an etchant, thus only the third gate insulating material 78a is etched. In other words, silicon nitride SiNx, the second gate insulating material, acts as an etch-stopper.

Accordingly, the first and second gate insulating films 62 and 76 are formed to cover the active layer 64 of the switch device SW, and the first to third gate insulating films 62, 76 and 78 are formed to cover the active layer 94 of the thin film transistor TP.

At this moment, the whole thickness of the first and second gate insulating films 62 and 76 of the switch device SW is relatively thinner than the whole thickness of the first to third gate insulating films 62, 76 and 78 of the thin film transistor TP. The whole thickness of the first and second gate insulating films 62 and 76 of the switch device SW may be formed to be thinner than the whole thickness of the first to third gate insulating films 62, 76 and 78 of the thin film transistor TP by about 5~2000 Å. The first and third gate insulating films 62 and 78 may be formed to be, e.g., about 5~2000 Å in thickness, and the second gate insulating films 76 may be formed to be, e.g., about 50~2000 Å in thickness.

Referring to FIG. 5D, the gate electrode 56 of the switch device SW and the gate electrode 86 of the thin film transistor TP are formed on the lower substrate 52 over the first and second gate insulating films 62 and 76 and the first to third gate insulating films 62, 76 and respectively, 78, which have a different thickness in accordance with whether it is the switch device SW or the thin film transistor TP.

To this end, the gate metal layer is deposited on the lower substrate 52 provided with the gate insulating films 62, 76 and 78, by a deposition method such as sputtering. The gate metal layer is formed of aluminum or aluminum alloy. Subsequently, the gate metal layer is patterned by a photolithography process and an etching process, thereby forming a gate electrode 56 of the switch device SW and a gate electrode 86 of the thin film transistor TP on the lower substrate 52.

Figure 5E:
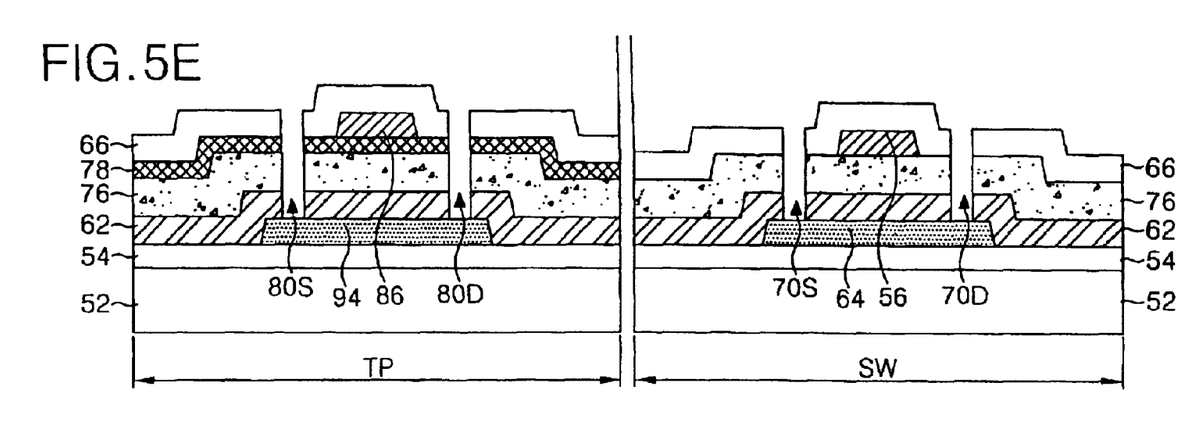

Referring to FIG. 5E, the go-between insulating film 66 is formed on the lower substrate 52 provided with the gate electrodes 56 and 86.

To this end, an insulating material is deposited on the entire surface of the lower substrate 52 provided with the gate electrodes 56 and 86, thereby forming the go-between insulating film 66. After this, a source contact hole 70S and a drain contact hole 70D of the switch device SW are formed to penetrate the go-between insulating film 66 and the first and second gate insulating films 62 and 76. At the same time, a source contact hole 80S and a drain contact hole 80D of the thin film transistor TP are formed to penetrate the go-between insulating film 66 and the first to third gate insulating films 62, 76 and 78.

Figure 5F:
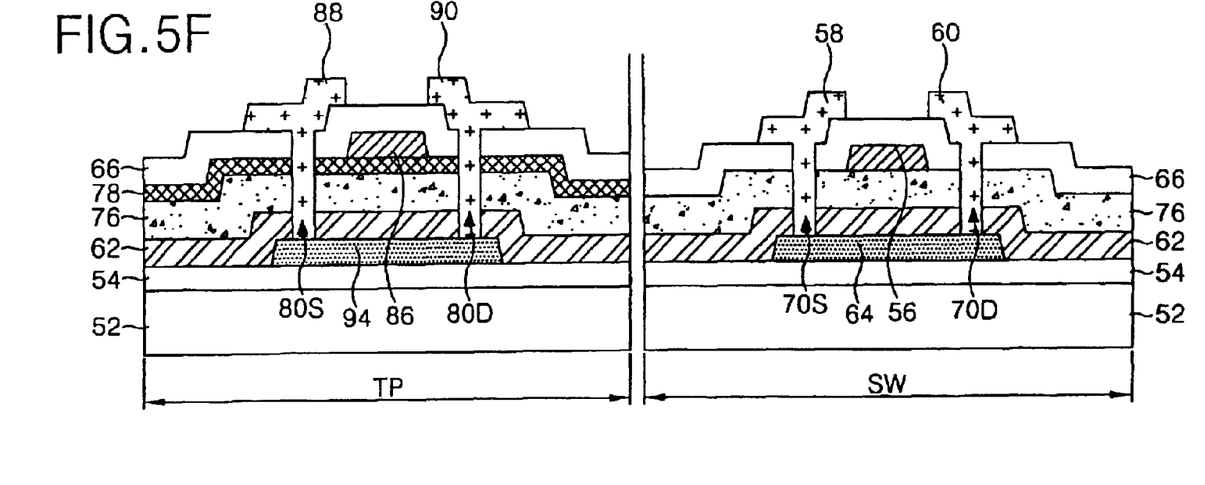

Referring to FIG. 5F, source electrodes 58 and 88 and drain electrodes 60 and 90 are formed on the lower substrate 52 provided with the go-between insulating film 66.

To this end, a data metal layer is deposited on the lower substrate 52 provided with the go-between insulating film 66 by the deposition method such as sputtering. After this, the data metal layer is patterned by the photolithography process and the etching process, thereby forming the source electrodes 58 and 88 and the drain electrodes 60 and 90 of the switch device SW and the thin film transistor TP on the lower substrate 52. Herein, the source electrode 58 and the drain electrode 60 of the switching device SW and the source electrode 88 and the drain electrode 90 of the thin film transistor TP are respectively connected to the active layers 64 and 94 through the source contact holes 70S and 80S and the drain contact holes 70D and 80D.

Figure 5G:
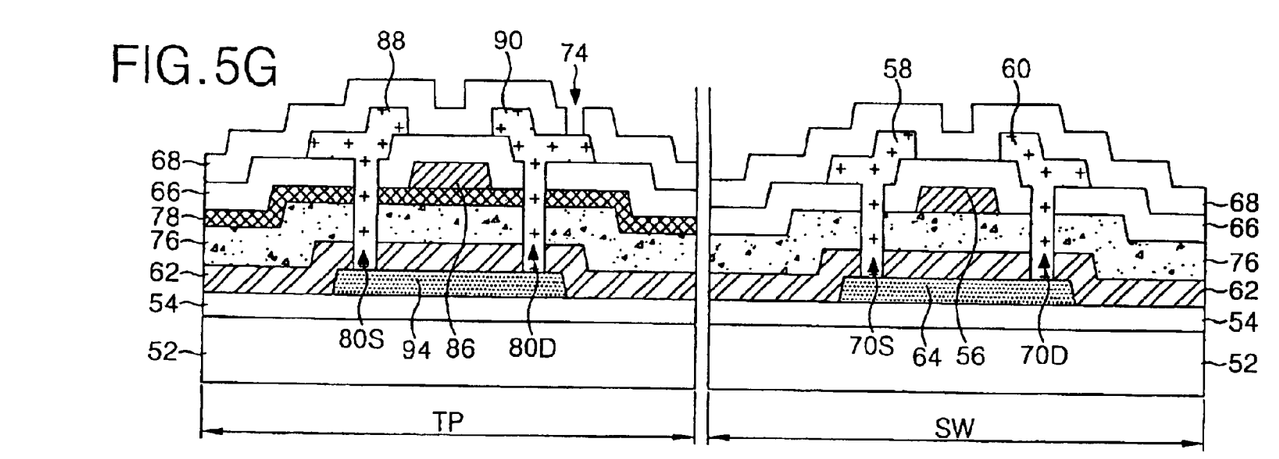

Referring to FIG. 5G the protective film 68 is formed on the lower substrate 52 provided with the source electrodes 58 and 88 and the drain electrodes 60 and 90.

To this end, an insulating material is deposited on the entire surface of the lower substrate 52 provided with the source electrodes 58 and 88 and the drain electrodes 60 and 90 of the switch device SW and the thin film transistor TP, thereby forming the protective film 68. After this, the protective film 68 is patterned by the photolithography process and the etching process, thereby forming the pixel contact hole 74 that penetrates the protective film 68 to expose the drain electrode 90 of the thin film transistor TP.

Figure 5H:
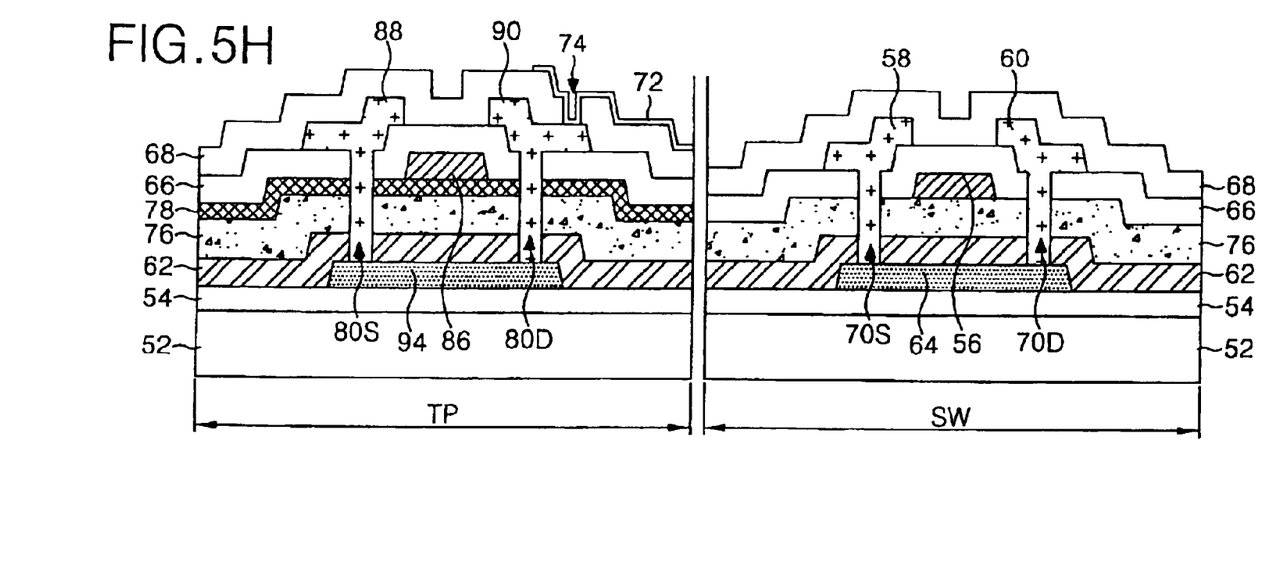

Referring to FIG. 5H, the pixel electrode 72 of the thin film transistor TP is formed on the lower substrate 52 provided with the protective film 68.

To this end, a transparent conductive material is deposited on the lower substrate 52 provided with the protective film 68. After this, the transparent conductive material is patterned by the photolithography process and the etching process, thereby forming the pixel electrode 72 connected to the drain electrode 90 of the thin film transistor TP. Herein, the pixel electrode 72 is electrically connected to the drain electrode 90 through the pixel contact hole 74.

As described above, the liquid crystal display and the fabricating method thereof according to the present invention forms the gate insulating film of the thin film transistor included in the picture display part to be different in thickness from that of the switch device included in the multiplexor. In other words, the first to third gate insulating films are formed between the active layer and the gate electrode of the thin film transistor, and the first and second gate insulating films are formed between the active layer and the gate electrode of the switch device. In this case, the second gate insulating film operates as the etch-stopper, thereby making the third gate insulating film selectively formed to cover the active layer of the thin film transistor. Accordingly, the whole thickness of the gate insulating film of the thin film transistor and the switch device is formed stably.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a first thin film transistor formed in a picture display part together with liquid crystal cells each provided at each crossing area of a plurality of signal lines for driving each of the liquid crystal cells;
   a second thin film transistor included in a drive circuit that generates a drive signal to drive the signal lines and formed in a drive circuit part located at the outer area of the picture display part; and
   a gate insulating film formed between an active layer and each gate electrode included in each of the first and second thin film transistors, and having a structure of at least two-layers, inclusive of an etch-stopper layer, and
   wherein the gate insulating films of the first and second thin film transistors are formed to have different thickness from each other.

2. The liquid crystal display according to claim 1, wherein the gate insulating film of the first thin film transistor is formed to be thicker than the gate insulating film formed between the active layer and the gate electrode of the second thin film transistor.

3. The liquid crystal display according to claim 1, wherein the gate insulating film of the first thin film transistor has a structure of three layers, the middle layer of which is the etch-stopper layer.

4. The liquid crystal display according to claim 3, wherein the gate insulating film of the second thin film transistor has a structure of two layers, the uppermost layer of which is the etch-stopper layer.

5. The liquid crystal display device according to claim 1, wherein the gate insulting film of the second thin film transistor has a structure of two layers, the uppermost layer of which is the etch-stopper.

6. The liquid crystal display according to claim 1, wherein the response times of the first and second thin film transistors are different because of thickness of the gate insulating film.

7. The liquid crystal display according to claim 1, wherein the etch-stopper layer includes silicon nitride SiNx.

8. The liquid crystal display according to claim 1, wherein the uppermost layer and the lowermost layer of the gate insulating film of the first thin film transistor and the lowermost layer of the gate insulating film of the second thin film transistor include silicon dioxide $SiO_2$.

9. A method of fabricating a liquid crystal display having a first thin film transistor formed in a picture display part together with liquid crystal cells provided at each crossing area of a plurality of signal lines for driving each of the liquid crystal cells, and a second thin film transistor included in a drive circuit that generate a drive signal for driving the signal lines and formed at in a drive circuit part located at the outer part of the picture display part, the method, comprising:
   forming a gate insulating film between an active layer and each gate electrode included in each of the first and second thin film transistors, wherein the gate insulating film has a structure of at least two-layers, inclusive of an etch-stopper layer, and the gate insulating films of the first and second thin film transistors have different thickness from each other.

10. The method according to claim 9, further comprising:
    forming a buffer film of the first and second thin film transistors on a substrate;
    forming an active layer of the first and second thin film transistors on the buffer film;
    forming a gate electrode of each of the first and second thin film transistors on the gate insulating film;
    forming a go-between insulating film of the first and second thin film transistors on the gate insulating film provided with the gate electrode;
    forming a source electrode and a drain electrode of each of the first and second thin film transistors on the go-between insulating film;
    forming a protective film of the first and second thin film transistors; and
    forming a pixel electrode connected to the drain electrode of the first thin film transistor.

11. The method according to claim 9, wherein the gate insulating film of the first thin film transistor has a structure of three layers, the middle layer of which is the etch-stopper layer.

12. The method according to claim 11, wherein the gate insulating film of the second thin film transistor has a structure of two layers, the uppermost layer of which is the etch-stopper layer.

13. The method according to claim 9, wherein the gate insulating film of the second thin film transistor has a structure of two layers, the uppermost layer of which is the etch-stopper layer.

14. The fabricating method according to claim 9, wherein the etch-stopper layer includes silicon nitride SiNx.

15. The fabricating method according to claim 9, wherein the uppermost layer and the lowermost layer of the gate insulating film of the first thin film transistor and the lowermost layer of the gate insulating film of the second thin film transistor include silicon dioxide $SiO_2$.

* * * * *